US012729311B2

(12) United States Patent
LaGrandeur et al.

(10) Patent No.: US 12,729,311 B2
(45) Date of Patent: Sep. 8, 2026

(54) SOLAR ADDITIVE COMPOSITION AND USES THEREOF

(71) Applicants: Joseph LaGrandeur, Concord, CA (US); Mark Hatton, Concord, CA (US)

(72) Inventors: Joseph LaGrandeur, Concord, CA (US); Mark Hatton, Concord, CA (US)

( * ) Notice: Subject to any disclaimer, the term of this patent is extended or adjusted under 35 U.S.C. 154(b) by 447 days.

(21) Appl. No.: 18/510,252

(22) Filed: Nov. 15, 2023

(65) Prior Publication Data

US 2024/0174870 A1 May 30, 2024

Related U.S. Application Data

(60) Provisional application No. 63/428,017, filed on Nov. 25, 2022.

(51) Int. Cl.

| | |
|---|---|
| ***C09D 5/32*** | (2006.01) |
| ***C08K 3/02*** | (2006.01) |
| ***C08K 3/04*** | (2006.01) |
| ***C08K 3/08*** | (2006.01) |
| ***C09D 5/24*** | (2006.01) |
| ***C09D 7/20*** | (2018.01) |
| ***C09D 7/40*** | (2018.01) |
| ***C09D 7/61*** | (2018.01) |
| ***C09D 7/80*** | (2018.01) |
| ***C09D 133/04*** | (2006.01) |
| ***H10K 85/10*** | (2023.01) |
| ***H10N 15/00*** | (2023.01) |

(52) U.S. Cl.

CPC ................ *C09D 5/32* (2013.01); *C09D 5/24* (2013.01); *C09D 7/20* (2018.01); *C09D 7/61* (2018.01); *C09D 7/69* (2018.01); *C09D 7/80* (2018.01); *C09D 133/04* (2013.01); *H10K 85/141* (2023.02); *C08K 2003/023* (2013.01); *C08K 3/04* (2013.01); *C08K 2003/0812* (2013.01); *C08K 2003/085* (2013.01); *C08K 2201/001* (2013.01); *C08K 2201/006* (2013.01); *H10N 15/00* (2023.02)

(58) Field of Classification Search

CPC ................ C08K 3/04; C08K 2003/023; C08K 2003/0812; C08K 2003/085; C08K 2201/001; C08K 2201/006; C09D 5/32; C09D 5/24; C09D 7/20; C09D 7/61; C09D 7/69; C09D 7/80; C09D 133/04

See application file for complete search history.

(56) References Cited

U.S. PATENT DOCUMENTS

2002/0157702 A1 10/2002 Cordaro

FOREIGN PATENT DOCUMENTS

| | | | | | |
|---|---|---|---|---|---|
| CN | 103773228 A | * | 5/2014 | ........... | C09D 183/04 |
| CN | 105713502 A | * | 6/2016 | ............... | C09D 7/65 |
| CN | 104356790 B | * | 10/2016 | ............... | C09D 7/61 |
| CN | 107699092 A | * | 2/2018 | ............... | C09D 5/32 |

* cited by examiner

*Primary Examiner* — Anthony J Green

(74) *Attorney, Agent, or Firm* — Pete Tormey

(57) ABSTRACT

The present disclosure relates to a solar additive composition comprising at least an inorganic solid material comprising particles and an organic solvent, wherein the additive may be added to a water-based acrylic paint providing high solar absorption property to the acrylic paint, wherein the acrylic paint with solar additive may absorb solar energy and convert the solar energy into electricity.

1 Claim, No Drawings

SOLAR ADDITIVE COMPOSITION AND USES THEREOF

PRIORITY

This application claims the benefit of co-pending patent application 63/428,017 by the same inventors filed Nov. 25, 2022 which is incorporated by reference as if fully set forth herein.

DETAILED DESCRIPTION

While the presently disclosed composition and process are susceptible of embodiment in many different forms, there are shown in the figures and will herein be described in detail several specific embodiments with the understanding that the present disclosure is to be considered as an exemplification of the principles of the present technology and is not intended to limit the technology to the embodiments illustrated.

In various embodiments, the present disclosure provides a solar additive composition comprising: at least an inorganic solid material comprising particles and at least an organic solvent, wherein the additive may be added to a water-based medium, such as water-based acrylic paint providing high solar energy heat absorption to the water-based medium. The solar additive is a solar heat-absorbing paint additive wherein adding the disclosed additive to water-based paint forms solar paint providing solar radiation absorption properties to the paint such that the solar paint can be used to harvest solar energy. The harvested solar energy may then be converted into electricity.

In various embodiments, the inorganic solid material may be carbon, silicon, aluminum, boron, magnesium, zinc, gallium, copper, nickel, cadmium, chromium, potassium, nanomaterials, or arsenic. In various other embodiments, the inorganic solid material may be carbon powder, silicon metal powder, aluminum powder, and/or copper powder. In various other embodiments, the inorganic solid material comprises micron or macron-sized particles. Further, the water-based medium may be water-based paint, such as acrylic paint, emulsion paint for exterior wall paint, or paint to harvest solar energy to generate electricity.

In various embodiments, the organic solvent may be alcohol, such as ethyl alcohol methanol, ethanol, propyl alcohol, isopropanol, n-butanol, tert-butyl alcohol, ethyl acetate, acetone, acetic acid, hexane, heptane, benzene, toluene, aromatic hydrocarbons, amines, esters, ketones, or aliphatic hydrocarbons. In various other embodiments, the organic solvent is 70% denatured alcohol.

In various embodiments, the disclosure relates to a solar additive composition for paints comprising at least a part carbon powder, at least a part silicon powder, at least a part aluminum powder, at least a part copper powder, or at least a part organic solvent. In various other embodiments, the disclosure relates to a solar additive composition for paints comprising at least two parts carbon powder, at least two parts silicon powder, at least two parts aluminum powder, at least two parts copper powder, or at least two parts organic solvent. In many embodiments, the disclosure relates to a solar additive composition for paints comprising one to three parts carbon powder, one to three parts silicon powder, one to three parts aluminum powder, one to three pails copper powder, one to three parts organic solvent or a combination thereof.

In various other embodiments, the silicon powder is silicon metal powder. Further, the carbon powder comprises particles ranging from 5-15 microns in size, preferably 10-micron in size.

In various embodiments, the disclosure relates to a process of reducing the harvested solar energy into electricity by connecting solar paint with conductive wires. The wires may be made of aluminum, copper or other conductive material. The process comprises coating at least a coat of solar paint for harvesting electricity or at least two coats of solar paint for harvesting electricity, or at least three coats of solar paint for harvesting electricity. In many embodiments, if more than one coat of paint is applied, each coat of paint is dried before applying the next coat of paint over the dried coat of paint.

In various embodiments, the process of producing electricity using the disclosed solar paint comprises applying a first coat of paint over a surface of choice, leaving the first coat of paint to dry, forming a first dry layer of paint, applying a second coat of paint over the first dry layer of paint, placing wires on each side of the second coat of paint, leaving the second coat of paint to dry forming a second dry layer of paint, applying a third coat of paint over the second dry layer of paint, leaving the third coat of paint to dry, exposing the third coat of paint to sunlight, wherein wires within solar paint will convert solar energy from sunlight into electricity. In various other embodiments, at least a coat of solar paint may be applied on a surface. In many embodiments, a plurality of coats of solar paint may be applied on a surface.

In various other embodiments, solar paint converts solar energy into electricity through wires, wherein wires are placed in between layers of solar paint at the time of applying solar paint over a surface such that wires become a part of the solar paint. In many embodiments, the wires may be braided wires or solid wires, such as for example, only braided copper wires or solid copper wires. The wires may be copper, aluminum, or other wires with conductive properties for producing electricity. The solar paint absorbs solar energy, wherein solar paint converts the solar energy into electricity.

In many embodiments, the disclosure relates to a method of preparing solar additive comprising the steps of (a) mixing at least one part carbon power, at least one part silicon powder, at least one part aluminum powder, and at least one part copper powder to prepare a solid mixture; (b) adding at least one part alcohol to the solid mixture to prepare a solution; (c) centrifuging the solution prepared in step (b); (d) stirring the solution at regular intervals until the solution turns into a dry powder, wherein the dry powder may be added to water-based paint, such as water-based acrylic paint forming solar paint. Solar paint comprises heat absorbing properties wherein the paint may absorb solar radiations and further convert the solar radiations into electricity. In many embodiments, the alcohol may be ethyl alcohol, e.g., 70% denatured alcohol, wherein alcohol increases the viscosity and conductivity of the additive. Therefore, the solar additive promotes energy production by harvesting solar energy.

In many embodiments, the solution prepared in step (b) above may be centrifuged for at least 15 minutes, preferably 20 minutes at 4000 rpm. In many other embodiments, the stirring may be performed at twenty-minute intervals for at least an hour for the liquid in the solution to evaporate, leaving the solution as dry powder. In various embodiments, the stirring may be performed at regular intervals until the liquid in the solution completely evaporates, turning into dry powder.

In various embodiments, the solar additive can be added to any water-based acrylic coating to form solar paint. The solar paint may be coated on any surface exposed to the sun, such as exterior walls.

In various embodiments, the solar additive may impart dark color to the paint, such as black paint. The dark color helps in more heat absorption compared to light color paints.

In various embodiments, the disclosed solar additive has a solar absorption of at least 50% in the solar spectrum range, such as the 250-3000 nm range.

In various embodiments, the disclosed solar additive has a solar absorption of at least 60% in the solar spectrum range, such as the 250-3000 nm range.

In various embodiments, the disclosed solar additive has a solar absorption of at least 70% in the solar spectrum range, such as the 250-3000 nm range.

In various embodiments, the disclosed solar additive has a solar absorption of at least 80% in the solar spectrum range, such as the 250-3000 nm range.

In various embodiments, the disclosed solar additive has a solar absorption of at least 90% in the solar spectrum range, such as the 250-3000 nm range.

In various embodiments, the disclosed solar additive has a solar absorption of at least 95% in the solar spectrum range, such as the 250-3000 nm range.

In various embodiments, the disclosed solar paint may comprise at least one agent selected from the group consisting of a wetting agent, a dispersing agent, a thickening agent and a defoaming agent.

In various embodiments, the disclosed solar additive composition may further comprise inorganic material selected from the group consisting of oxides, silicates, borates, borides, aluminum, magnesium, silicon, titanium, copper, carbon, graphite and their mixtures.

In the description, for purposes of explanation and not limitation, specific details are set forth, such as particular embodiments, procedures, techniques, etc., to provide a thorough understanding of the present technology. However, it will be apparent to one skilled in the art that the present technology may be practiced in other embodiments that depart from these specific details.

While specific embodiments of, and examples of, the process and compositions are described above for illustrative purposes, various equivalent modifications are possible within the scope of the system, as those skilled in the relevant art will recognize.

For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways.

Also, while processes or steps are at times shown as being performed in series, these processes or steps may instead be performed in parallel or may be performed at different times.

While various embodiments have been described above, it should be understood that they have been presented by way of example only and not in limitation. The descriptions are not intended to limit the scope of the present technology to the particular forms set forth herein. To the contrary, the present descriptions are intended to cover such alternatives, modifications, and equivalents as may be included within the spirit and scope of the present technology as appreciated by one of ordinary skill in the art. Thus, the breadth and scope of a preferred embodiment should not be limited by any of the above-described exemplary embodiments.

What is claimed is:

1. A method of preparing a solar additive comprising the steps of:

(a) mixing at least one part carbon powder, at least one part silicon powder, at least one part aluminum powder, and at least one part copper powder to prepare a solid mixture;

(b) adding at least one part alcohol to the solid mixture to prepare a solution;

(c) centrifuging the solution prepared in step (b) for at least 15 minutes;

(d) stirring the solution at regular intervals until the solution turns into a dry powder, wherein the dry powder when added to water-based paint, forms solar paint.

* * * * *